United States Patent [19]

Sussman et al.

[11] Patent Number: 5,664,926

[45] Date of Patent: Sep. 9, 1997

[54] STAGE ASSEMBLY FOR A SUBSTRATE PROCESSING SYSTEM

[75] Inventors: Jay S. L. Sussman; Daniel A. Babbs; Richard E. Shultz, all of Austin, Tex.

[73] Assignee: Progressive System Technologies, Inc., Austin, Tex.

[21] Appl. No.: 500,595

[22] Filed: Jul. 11, 1995

[51] Int. Cl.$^6$ ...................................... B65G 65/00
[52] U.S. Cl. ...................... 414/222; 414/331; 414/416; 414/743; 414/778; 414/786; 414/936; 414/937; 414/940
[58] Field of Search ...................... 414/331, 416, 414/222, 778, 779, 781, 776, 742, 743, 940, 935–937, 786, 744.4

[56] References Cited

U.S. PATENT DOCUMENTS

| 2,764,459 | 9/1956 | McDonald | 414/743 X |
|---|---|---|---|
| 4,776,744 | 10/1988 | Stonestreet et al. | 414/940 X |
| 4,859,137 | 8/1989 | Bonora et al. | 414/940 X |
| 4,886,412 | 12/1989 | Wooding et al. | 414/416 |
| 4,951,601 | 8/1990 | Maydan et al. | 414/937 X |
| 4,995,063 | 2/1991 | Enoki et al. | 414/937 X |
| 5,382,806 | 1/1995 | Bacchi et al. | 414/940 X |
| 5,443,348 | 8/1995 | Biche et al. | 414/940 X |
| 5,464,313 | 11/1995 | Ohsawa | 414/940 X |
| 5,474,410 | 12/1995 | Ozawa et al. | 414/940 X |
| 5,507,614 | 4/1996 | Leonov et al. | 414/940 X |
| 5,525,024 | 6/1996 | Freerks et al. | 414/940 X |
| 5,538,385 | 7/1996 | Bacchi et al. | 414/940 X |

FOREIGN PATENT DOCUMENTS

| 72137 | 4/1988 | Japan | 414/940 |
|---|---|---|---|
| 181441 | 7/1988 | Japan | 414/937 |
| 285948 | 11/1988 | Japan | 414/937 |
| 248443 | 11/1991 | Japan | 414/940 |
| 157755 | 5/1992 | Japan | 414/937 |
| 251954 | 9/1992 | Japan | 414/937 |

OTHER PUBLICATIONS

Fortrend Engineering Brochure "Fortrend Wafer Transfer Systems" (date/author unknown).
Fortrend Engineering Brochure "The Fortrend Sorter" (date/author unknown).
Kensington Laboratories Inc. Brochure "Compact Carrier Scanning Platform" (date/author unknown).

*Primary Examiner*—David A. Bucci
*Attorney, Agent, or Firm*—Stanford & Bennett

[57] ABSTRACT

A stage assembly for a substrate processing system including a cassette support assembly for receiving and supporting a cassette and an actuation and support assembly for supporting and moving the cassette and cassette support assembly between a loading position and a processing position. The processing position provides convenient and efficient access by a central processing system, and the loading position preferably places each cassette closer to, and aligned with, a front panel of the processing system for convenient access by an operator. The actuator and support assembly preferably includes a frame assembly and a rotating plate pivotally mounted to the frame assembly, where the cassette support assembly is mounted to the rotating plate for pivoting relative to the frame assembly. An actuator assembly mounted to the frame assembly flits the cassette support assembly between the loading and processing positions. A shaft assembly pivotally mounts the cassette support assembly to the rotating plate. An adjustable linkage assembly is mounted between the frame assembly and the shaft assembly, so that the cassette support assembly is rotated or swiveled by an adjustable amount between the loading and processing positions.

20 Claims, 11 Drawing Sheets

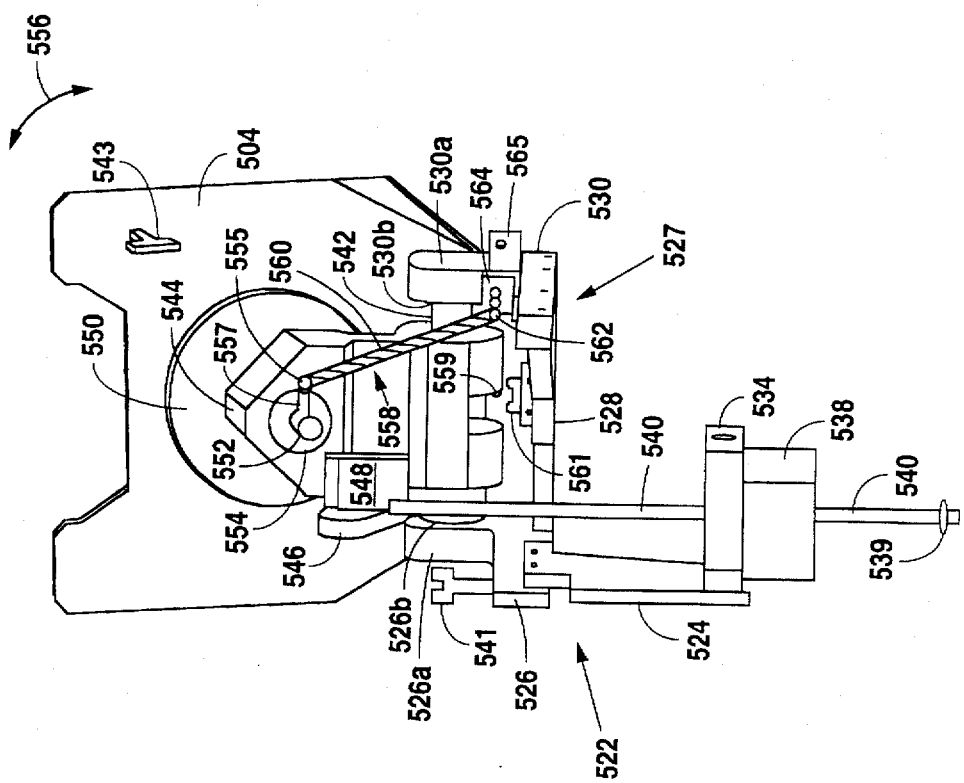

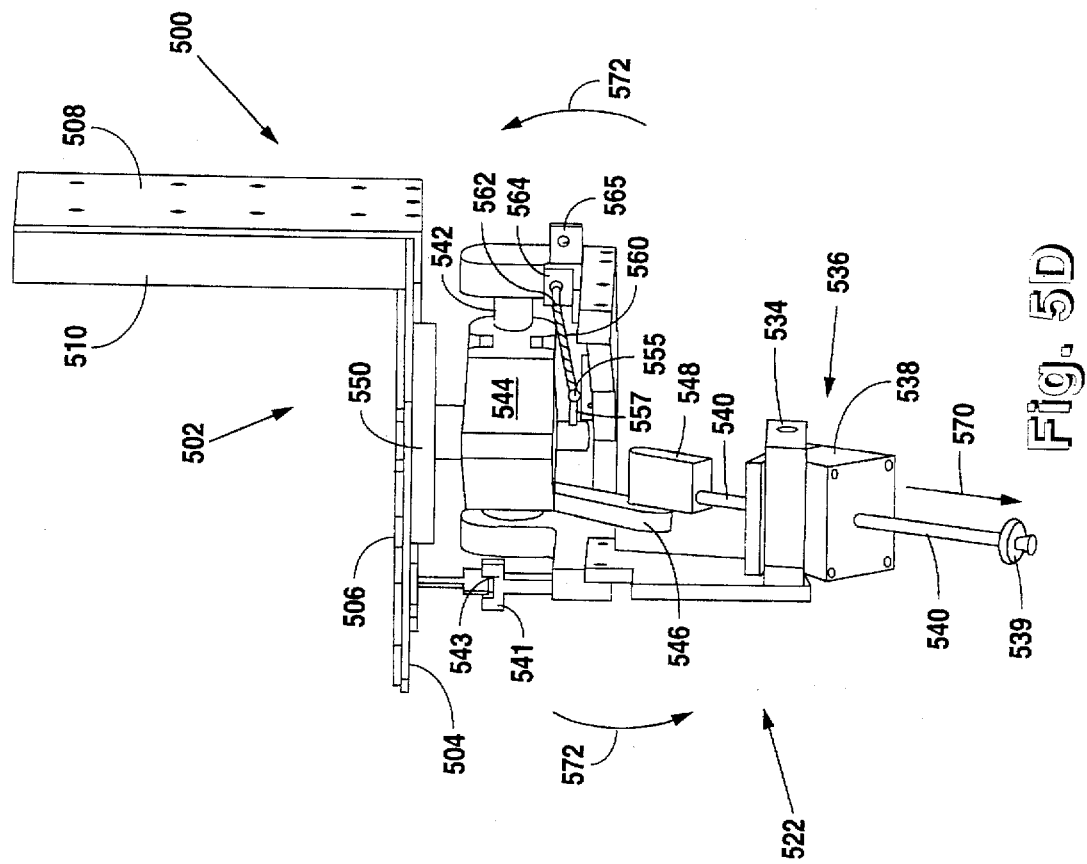
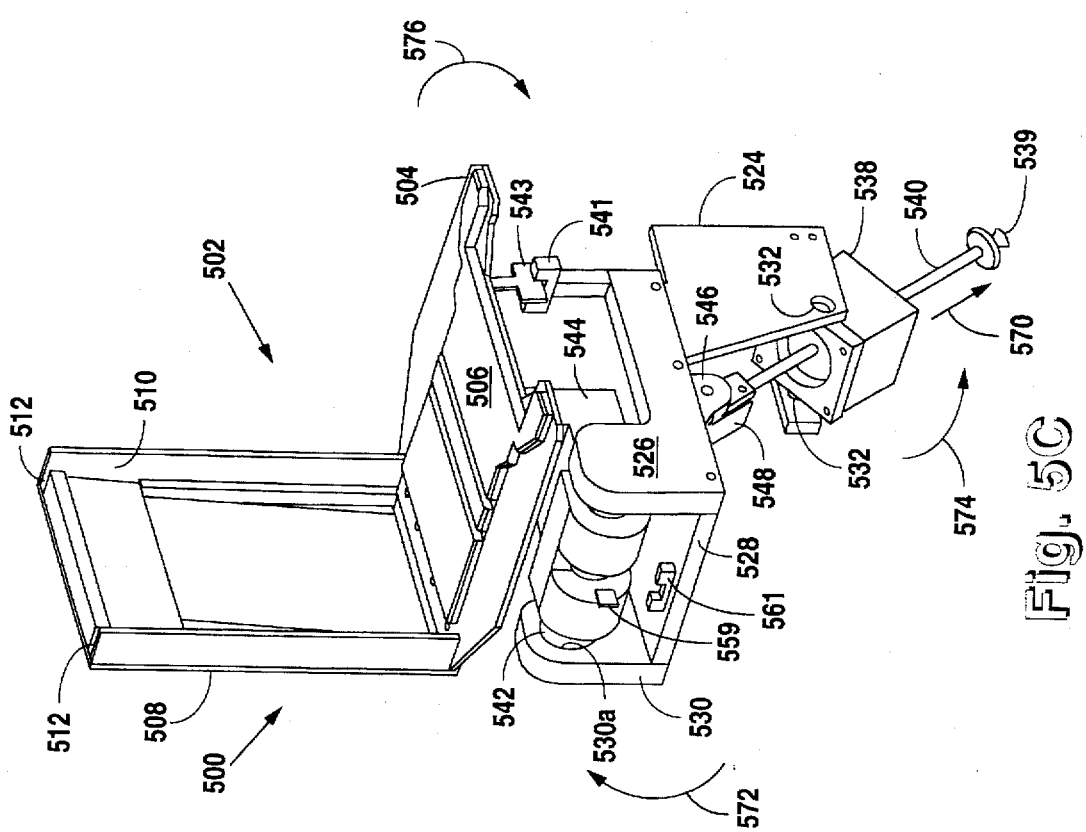
Fig. 5D
Fig. 5C

STAGE ASSEMBLY FOR A SUBSTRATE PROCESSING SYSTEM

FIELD OF THE INVENTION

The present invention relates to a stage assembly for substrate processing systems, and more particularly to a stage assembly for supporting and moving a substrate cassette between a processing position for access by a robotic processing system and a loading position for convenient access by an operator.

DESCRIPTION OF THE RELATED ART

Semiconductor substrates, such as wafers, masks, flat panel displays (FPDs), etc. are typically transported between, and processed by, one or more automatic processing stations in a substantially clean environment. Semiconductor wafers are generally round and flat silicon disks with a diameters of four, six, eight, twelve etc. inches. FPDs are generally flat, rectangular plates having various sizes, including relatively large FPDs measuring 550 millimeters (mm) by 650 mm. The present invention generally concerns the handling of any type of substrate and is not limited to the substrates listed or described herein.

One or more such substrates are often inserted into a box-like plastic cassette, which includes a plurality of coplanar slots or combs for maintaining and supporting the substrates in a spaced relationship relative to each other. Each cassette is implemented for the particular type of substrate, and usually includes an open face for allowing insertion, removal and access of substrates inserted therein. The cassette provides support for the substrates during processing, where the system is more easily able to retrieve and deposit the cassettes before and after processing. Such cassettes also enable more convenient transportation of the substrates from one processing station to another within the working environment. Often, an operator carries one or more such cassettes on a cart or the like between processing stations, and then unloads cassettes from the station and/or loads new cassettes onto the station.

The size and weight of the substrates and/or cassettes are important considerations. Although an operator may use a cart for transporting the cassettes between stations, the operator must still lift each cassette for loading and unloading the cassette. The cassettes must be ruggedly designed to provide the desired support and protection of the substrates inserted therein, and thus are relatively heavy. The relative weight is less of a concern for smaller cassettes for handling smaller substrates, such as four-inch wafers, but the weight becomes more important with increasing size, especially for a fully loaded cassette of FPDs.

Each processing station typically includes a plurality of fixed platforms or "stages" for receiving and positioning the cassettes to enable desired access by a processing system, such as an automatic robot system. In one particular known robotic processing system, four stages are positioned in a semicircle around a central robot system, where the open face of each cassette is positioned by the corresponding fixed stage to directly face the central robot for easy access to the substrates inserted therein. This enables maximum efficiency by reducing the complexity and cost of the centralized robot system, since the robot need only be rotated a certain mount to move from one cassette to the next. In the particular system referenced, the processing station includes a front panel and central robot with the fixed stages positioned around the central robot between the robot and the front control panel.

The positioning of the stages provides convenient access to the robot for processing purposes, but poses a significant inconvenience for the operator when loading or unloading the cassettes onto the corresponding stages. For the four-stage processing system described above, the inner two stages are positioned relatively near the front panel, but the two outer stages are each located half way around the robot and relatively far from the front panel. Thus, the two outer stages are positioned at a significant distance away from the front panel.

A relatively tall and strong operator may be able to load all of the stages from the front panel, particularly if the cassettes are relatively small. Nonetheless, it takes more time for the operator to reach across the station to load the outer stages as compared to the inner stages. The efficiency is dramatically reduced if the operator is shorter or does not have sufficient arm strength, or is otherwise unable to load all of the cassettes from the front panel. This is particularly true for larger substrates and cassettes or fully loaded cassettes. In those cases, the operator must walk around both sides of the station to load the outer stages.

Having to walk around both sides of the station dramatically decreases efficiency of the overall operation. First, this takes significantly more time, and substantially increases the fatigue of the operator over time. Second, this increases the footprint of the station to allow room for the operator to access the outer stages. This is especially problematic when a plurality of such stations are placed side by side in a large clean room environment, where each of the stations must be placed far enough apart to allow operator access in between. This reduces the maximum number of stations that may be placed within a given clean room environment, thereby reducing the total number of processing stages.

Even if an operator is able to load all of the cassettes from the front panel, the stages are fixed at angles relative to the front panel posing several problems. The operator must load the outer stages by lifting and stretching while also twisting his or her arms to load a cassette onto the outer stages. Such lifting and stretching is exacerbated by the longer distance of the outer stages from the front panel. Even the inner stages require loading at an angle, so that the operator must lift and twist his or her arms to properly position the cassette onto the stage.

Such continual stretching and twisting of the arms increases fatigue of the operator over time. Such continual lifting, stretching and twisting of the arms in the same repetitive manner over a Substantial amount of time may cause other detrimental health problems. The added strain, fatigue and other detrimental problems jeopardize the health of the operator, while also decreasing the operator's efficiency over time.

It has therefore been discovered that existing robotic processing stations having fixed stages positioned for convenient access by corresponding central processing systems cause inefficiencies and other detrimental problems for loading or unloading of the cassettes. It is desired to provide a processing station with convenient access for operator loading while also providing convenient access to a central processing system.

SUMMARY OF THE INVENTION

A stage assembly for a substrate processing system according to the present invention includes a cassette support assembly for receiving and supporting a cassette, and an actuation and support assembly for supporting and moving the cassette and cassette support assembly between a loading position and a processing position. The processing position is substantially unchanged for providing convenient and efficient access by the processing system, such as a central robot. The loading position preferably places each cassette closer to, and aligned with, a front panel of the processing system. In this manner, the cassette is positioned at a convenient location for the operator for purposes of loading and unloading from the front panel. The operator need not reach as far nor turn the cassette at various angles for loading and unloading the cassettes. Thus, a stage assembly according to the present invention substantially increases the efficiency and reduces or otherwise eliminates other problems associated with loading and unloading substrate cassettes.

In the preferred embodiment, a multistage processing system includes several stage assemblies according to the present invention. Each actuation and support assembly tilts its cassette support assembly upwards and towards the from panel to place it closer to the operator. Thus, the operator need not reach as far to load or unload, thereby decreasing the loading time and fatigue and increasing efficiency. Furthermore, a stage assembly according to the present invention provides convenient access to all cassettes and stages from the front panel so that the operator need never walk around to the side of the station. This effectively reduces the footprint of the station, since loading and unloading is completely accessible from the front panel. Thus, a plurality of such stations using stage assemblies according to the present invention may be placed closer to each other, thereby increasing station density. This further increases the processing capability of a given clean room.

The cassette is also preferably rotated or swiveled a certain amount depending upon the position Of the stage relative to the robot and the front panel. In particular, the outer stages located farthest from the front panel and facing a central robot are rotated at a greater amount than the inner panels positioned closer to the front panel. Each cassette support is preferably aligned parallel to each other and to the front panel in the loading position so that the operator need not twist or otherwise turn the cassettes for loading and unloading. This substantially simplifies the loading procedure and reduces stress, strain and fatigue of the operator.

In the preferred embodiment, four such stages are located in a semicircle about a central robot, where the two inner stages are rotated approximately thirty degrees and the two outer stages are rotated approximately ninety degrees, so that all four stages align the cassettes parallel with the front panel for convenient access by the operator.

In the preferred embodiment, the cassette support assembly includes a backplate mounted to a stage locator plate for receiving and supporting the cassette. The cassette is thus supported by the backplate in the position for loading and unloading and supported by the stage locator plate for supporting the cassette during processing. The open face of the cassette, if any, is preferably tilted upwards assuring greater safety of the inserted substrates during loading and unloading.

In the preferred embodiment, the actuator and support assembly includes a frame assembly and a rotating plate pivotally mounted to the frame assembly, where the cassette support assembly is mounted to the rotating plate for pivoting relative to the frame assembly. An actuator assembly mounted to the frame tilts the cassette support assembly between the loading and processing positions. A motor bracket is also pivotally mounted to the lower end of the frame assembly for supporting an actuator motor, which applies thrust force to a connecting rod coupled between the actuator motor and the rotating plate. In this manner, the actuator motor applies thrust force to the connecting rod for pivoting the cassette support assembly between the loading and processing positions. A crank arm is preferably mounted to the rotating plate, and a clamp is pivotally mounted to the crank arm for interfacing the connecting rod. The connecting rod preferably comprises a lead screw where the actuator motor interfaces lead screw for applying linear thrust force.

The frame assembly preferably comprises a base frame including bearings on its lower end for pivotally mounting the motor bracket. One end of a bearing block assembly is mounted to the upper end of the base frame and a bearing assembly is mounted on the other end for pivotally mounting the cassette support assembly.

In the preferred embodiment, a shaft assembly pivotally mounts the cassette support assembly to the rotating plate. A linkage assembly is mounted between the frame assembly and the shaft assembly so that the cassette support assembly is rotated or swiveled a predetermined amount between the loading and processing positions. The linkage assembly preferably includes first and second ball joints mounted to the shaft and frame assemblies, respectively, and a linkage arm is coupled between the first and second ball joints for applying swivel motion. The second ball joint is mounted to one of several positions on the frame assembly, and the linkage arm is telescopically adjustable for adjusting its length. In this manner, the amount of rotation of the cassette support assembly may be adjusted based upon the position of the ball joint and the length of the linkage arm.

A method of positioning a substrate cassette relative to a processing station including a central robotic system and a front panel comprises the steps of aligning the cassette to enable the robotic system to access substrates inserted within the cassette in a processing position, and moving the cassette towards the front panel for allowing convenient loading and unloading of cassettes from the front panel. The face of the cassette is preferably aligned at a tangent with respect to the working area of the robotic system in the processing position. In the loading position, the cassette is preferably tilted upwards and aligned parallel with the front panel.

It is now understood that a stage assembly according to the present invention provides convenient access of substrates loaded in a cassette by a robot system, as well as convenient access of loading and unloading of cassettes relative to respective stages. One or more of such stage assemblies are preferably used for a processing station and adjusted so that the cassettes are all conveniently accessible from a front panel of the processing station. This substantially increases efficiency and reduces or otherwise eliminates other problems associated with loading and unloading of substrate cassettes.

BRIEF DESCRIPTION OF THE DRAWINGS

A better understanding of the present invention can be obtained when the following detailed description of the preferred embodiment is considered in conjunction with the following drawings, in which:

FIG. 5A is a perspective view of a stage assembly according to the present invention in a loading position;

FIG. 5B is a reverse angle perspective view of the stage assembly of FIG. 5A;

FIG. 5C is a perspective view of the stage assembly of FIG. 5A in a processing position;

FIG. 5D is a reverse angle perspective view of the stage assembly of FIG. 5C;

DETAILED DESCRIPTION OF THE PREFERRED EMBODIMENTS

Figure 1:
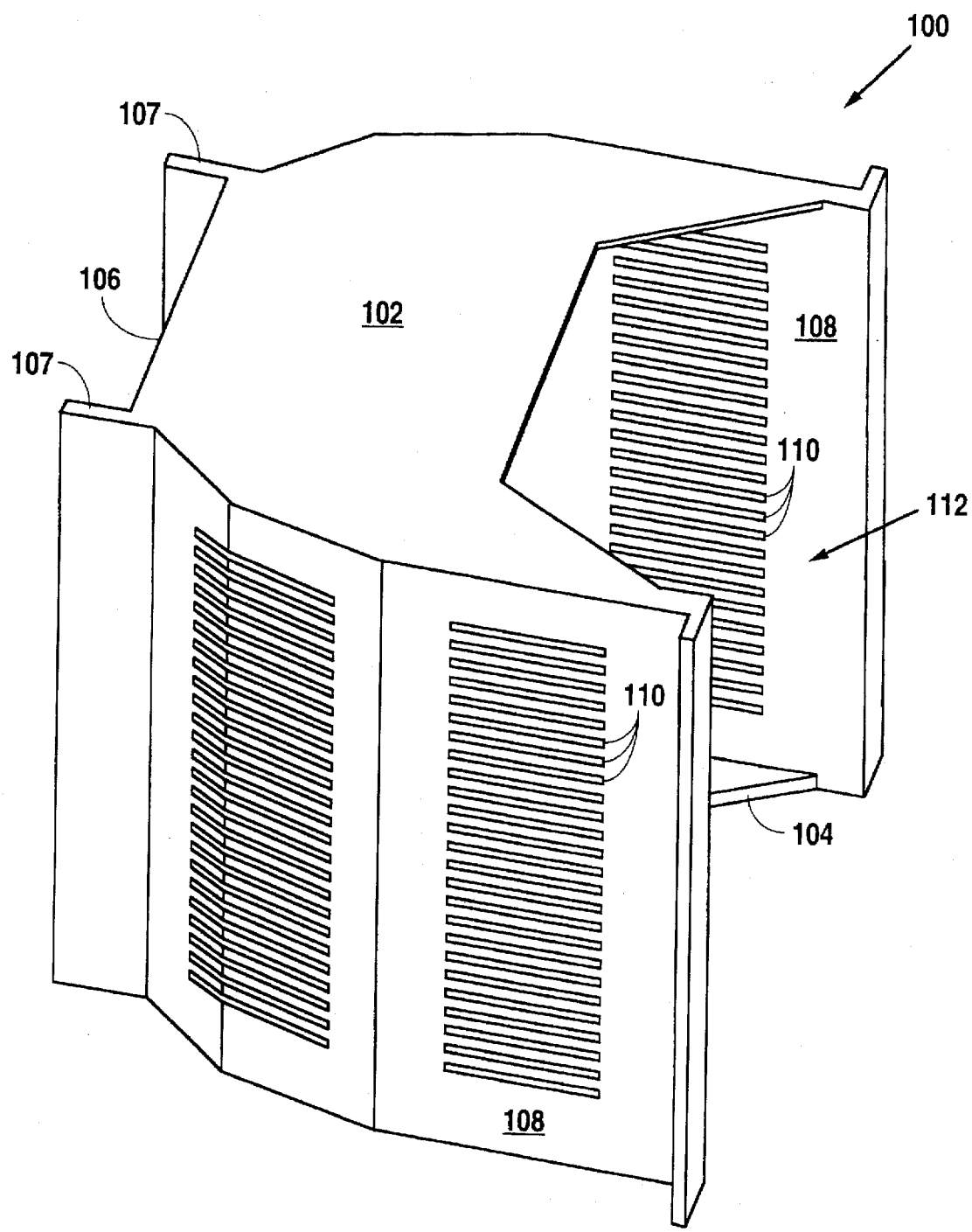
FIG. 1 is a perspective view of a cassette for holding substrates.

Referring now to FIG. 1, a perspective view is shown of a cassette 100 for loading a plurality of substrates, such as semiconductor wafers, masks, FPDs, etc., depending upon the types of substrates desired to be processed. The cassette 100 is particularly adapted for receiving and supporting round semiconductor wafers having diameters of six inches or 150 mm, or eight inches (200 mm), etc. as known to those skilled in the art.

The cassette 100 is preferably made of a hardened plastic material, and is a box-like structure including a top side 102, a bottom side 104, a back side 106 with alignment fins 107 and two sides 108. The sides 108 each include a plurality of slots 110 for receiving semiconductor wafers or the like from an open face 112 and maintaining the inserted substrates in a space relationship relative to each other. Such cassettes 100 facilitate handling, transportation and processing of the substrate wafers, FPDs, etc., as desired.

Figure 2A:
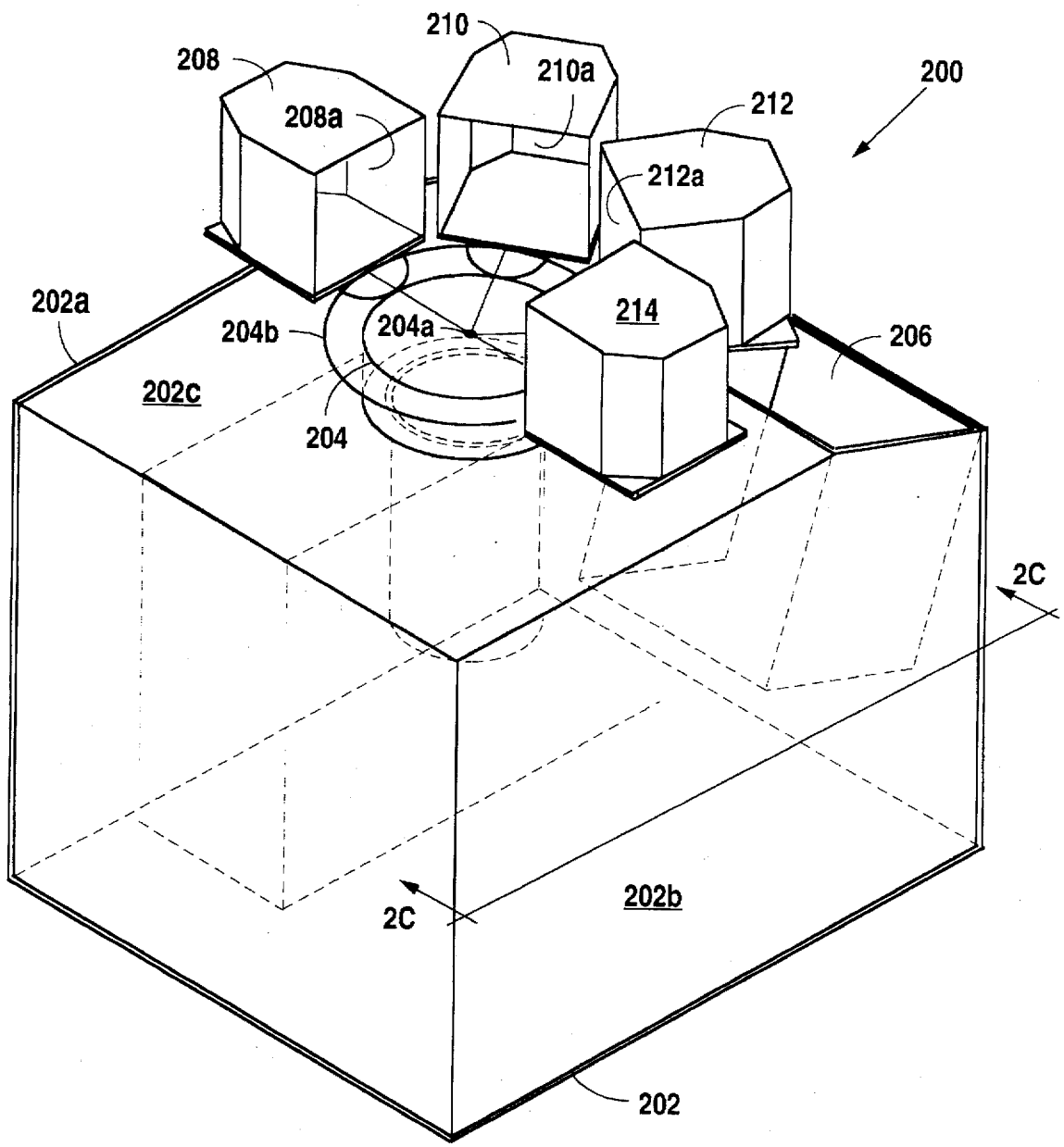
FIG. 2A is a perspective view of a robotic processing station according to the present invention with four stages in processing positions.

Referring now to FIG. 2A, a perspective view is shown of a robotic processing system 200 implemented according to the present invention. The processing system 200 preferably includes a cubicle support flame 202 with two sides 202a, 202b and a top side 202c for supporting a central robot 204 and a front control panel 206. The central robot 204 is centered at a center point 204a and is generally a single-arm articulated robot which pivots about the central point 204a for accessing substrates as described further below.

Four stage assemblies 216, 218, 220 and 222 (FIGS. 3A, 3B) implemented according to the present invention are provided to position and support four corresponding cassettes 208, 210, 212 and 214 in a semicircle surrounding the central robot 204. In the positions shown in FIG. 2A, the cassettes 208, 210, 212 and 214 include square open faces 208a, 210a, 212a and 214a, which are tangentially positioned relative to a cylindrical operating area 204b of the central robot 204 for allowing easy access of the substrates or semiconductor wafers inserted within the respective cassettes 208, 210, 212 and 214. In particular, the two outer cassettes 208 and 214 are positioned on opposite sides of the frame assembly 202, where their respective open faces 208a and 214a are positioned at 90° angles relative to the front panel 206. Since the cassettes 208 and 214 are positioned on either side of the central robot 204, they are positioned relatively far from the front panel 206, and therefore not very accessible for loading and unloading. The two inner cassettes 210 and 212 likewise are positioned with their open faces 210a and 212a, respectively, in tangential relationship relative to the cylindrical operating area 204b of the central robot 204, where the open faces 210A and 212A are positioned at a 30° angle relative to the front panel 206. The inner cassettes 210, 212 are positioned closer to the front panel 206.

Figure 3A:
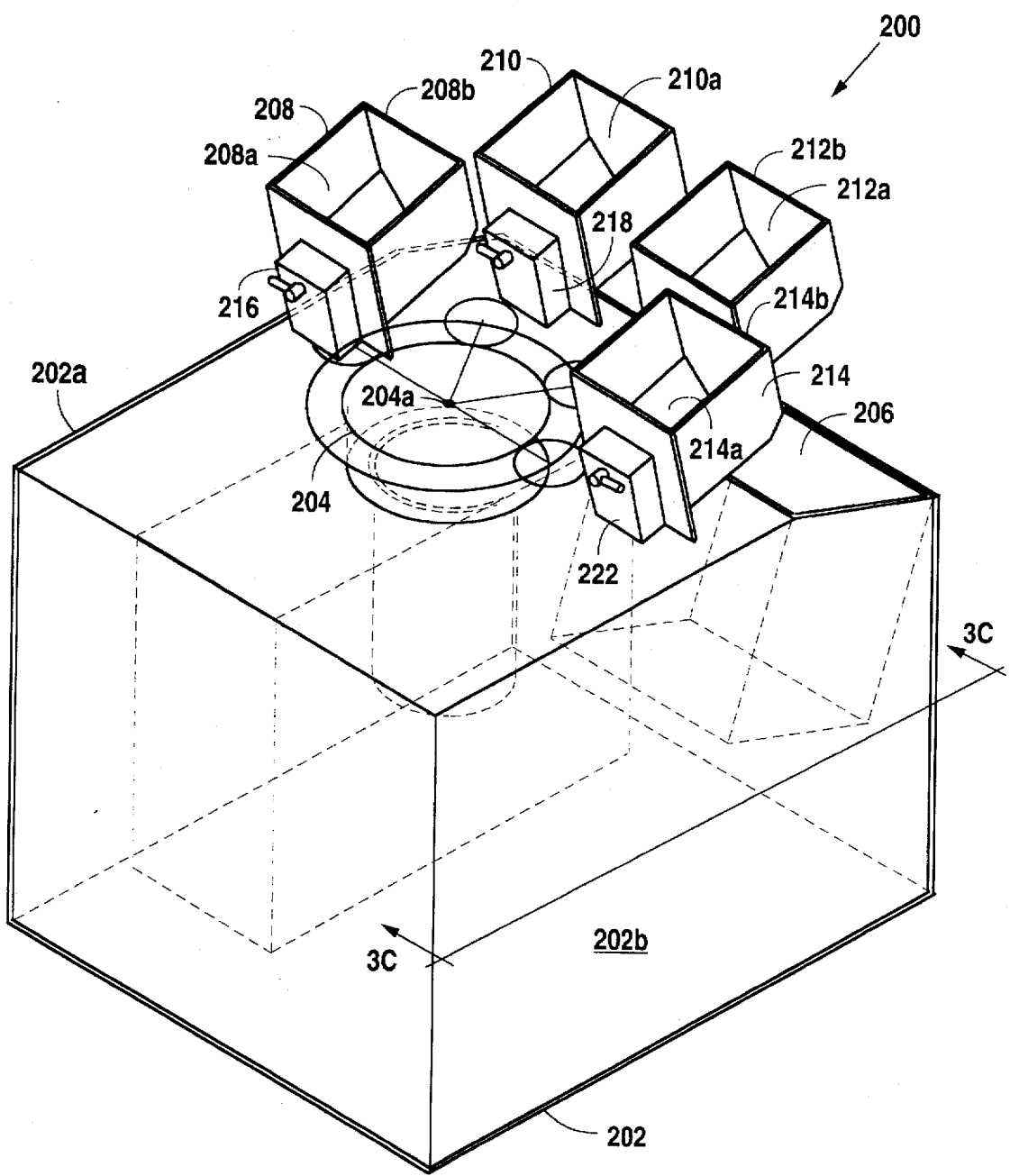
FIG. 3A is a perspective view of the robotic processing system of FIG. 2A, where the four stages are in loading positions.

As will be described more fully below, stage assemblies support each of the cassettes 208, 210, 212 and 214 between the processing positions shown and loading positions as shown in FIG. 3A. A prior art processing system appeared similar to the processing system 200 shown in FIG. 2A, except that the stage assemblies were fixed so that the cassettes 208, 210, 212 and 214 were fixed in the processing positions. This presented substantial problems for an operator attempting to load and unload the cassettes 208, 210, 212 and 214 onto the processing station 200 from the front panel 206.

In particular, an operator had to stretch his or her arms over the frame 202 while rotating or otherwise twisting his or her arms to position each of the outer cassettes 208, 214 in the processing positions shown. This was possible if the cassettes were relatively small or otherwise not substantially full or if the operator was relatively tall and strong. However, if the cassettes were relatively large for handling larger and heavier substrates, such as large FPDs, or even if the cassettes were smaller but fully loaded, it became more difficult to load the outer cassettes 208, 214 into the fixed processing positions. In many situations, a cassette was simply too large or the operator was not strong enough to place the cassettes in the outer positions. In such situations, the operator had to walk around to either side 202a, 202b of the frame 202 in order to load the outer cassettes 208, 214. This posed substantial inefficiencies by increasing fatigue and the amount of time required for loading and unloading of the cassettes.

Furthermore, for relatively larger processing systems, where operators had to walk around to the sides 202a, 202b, a plurality of such stations placed side by side had to be placed far enough apart to allow room for the operator. In this manner, a significantly smaller number of such processing stations were distributed in a given clean room environment, thereby reducing the overall productivity for that environment.

Even if the cassettes were small enough or if an operator was strong enough, loading the outer cassettes 208 and 214 still caused strain and fatigue for an operator having to stretch across the front panel 206 to the respective processing positions. Furthermore, the operator had to twist his or her arms to properly align the cassettes 208, 214, leading to other health problems when such stretching and twisting of the arms was repeated many times throughout the work day. This substantially led to increased fatigue and the development of other health risks related to repeated strained movement of the arms and body.

Although the inner stage assemblies for loading the cassettes 210 and 212 are less problematic, repetitive loading of such cassettes at an angle throughout the day tended to increase fatigue as well as to increase the chances of other health problems related to repetitive strained movement as described above. In this manner, although to a lesser degree, the constant loading and unloading of the inner cassettes 210 and 212 in the positions shown caused problems for the operator, thereby decreasing efficiency during the loading and unloading process.

Figure 2B:
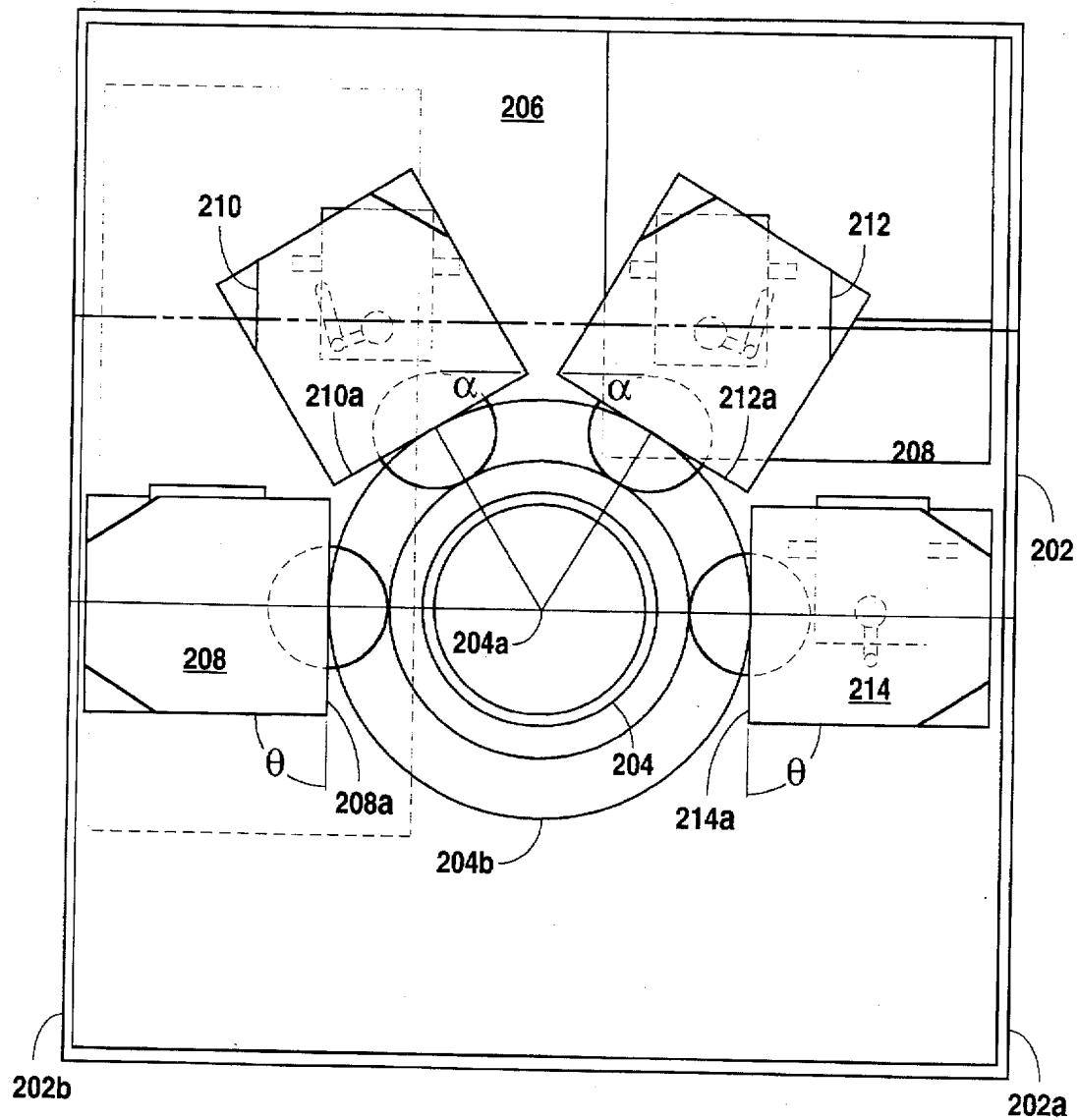
FIG. 2B is a top view of the robotic processing station of FIG. 2A.

FIG. 2B is a top view of the processing station 200 more clearly illustrating the tangential position of the front open faces 208a, 210a, 212a and 214a, respectively, of the cassettes 208, 210, 212 and 214 relative to the cylindrical operating area 204b of the central robot 204. Furthermore, the relative angles of the open faces 210a and 212a at α=30° relative to the front panel 206, and of the open faces 208a, 214a at an angle θ=90° relative to the front panel 206, illustrating the angle of rotation of each of the cassettes.

Figure 2C:
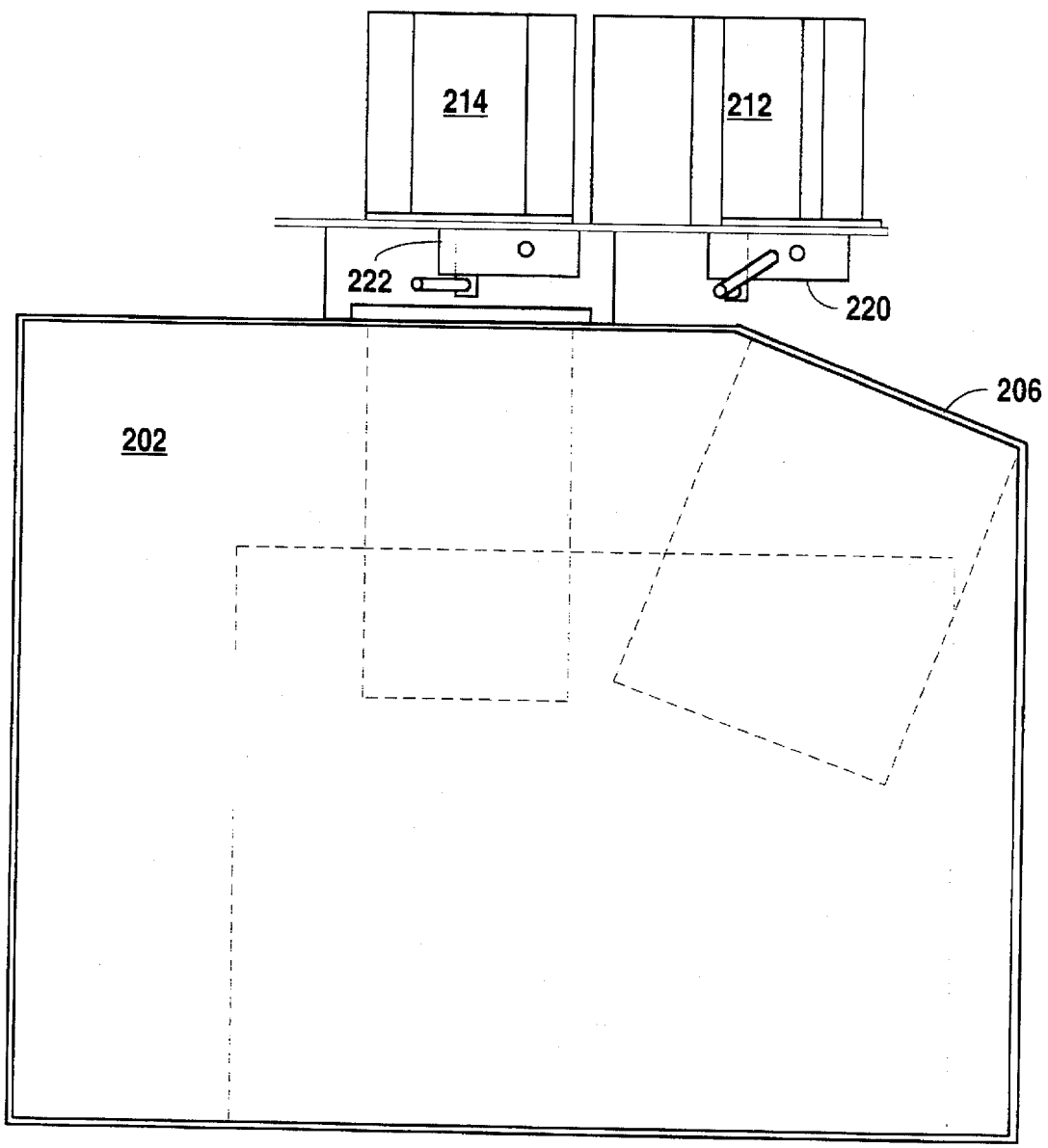
FIG. 2C is a side view looking along lines 2C—2C of FIG. 2A.

FIG. 2C is a side view of the processing station 200 looking along lines 2C—2C of FIG. 2A. The back side of the cassette 214 is shown positioned on a stage assembly 222, although shown simplified for purposes of clarity. The cassette 212 is shown loaded similar stage assembly 220, where the stage assemblies 220 and 222 will be described more fully below.

Referring now to FIG. 3A, a perspective view is shown of the robotic processing station 200 showing the cassettes 208, 210, 212 and 214 in their respective loading positions for loading and unloading purposes. FIG. 3A more clearly illustrates stage assemblies 216, 218 for moving and supporting the respective cassettes 208 and 210. Likewise, the stage assembly 222 is shown for moving and supporting the cassette 214, although stage 220 is not shown since hidden behind the cassette 214. FIG. 3A illustrates the loading positions for each of the cassettes 208, 210, 212 and 214, where the respective open faces 208a, 210a, 212a and 214a are positioned to face upwards, so that the cassettes are each supported on their respective back sides by the respective stage assemblies 216, 218, 220 and 222. Upper ends 208b, 210b, 212b and 214b of the open faces 208a, 210a, 212a and 214a, respectively, are aligned, preferably in parallel, with the from panel 206.

Figure 3B:
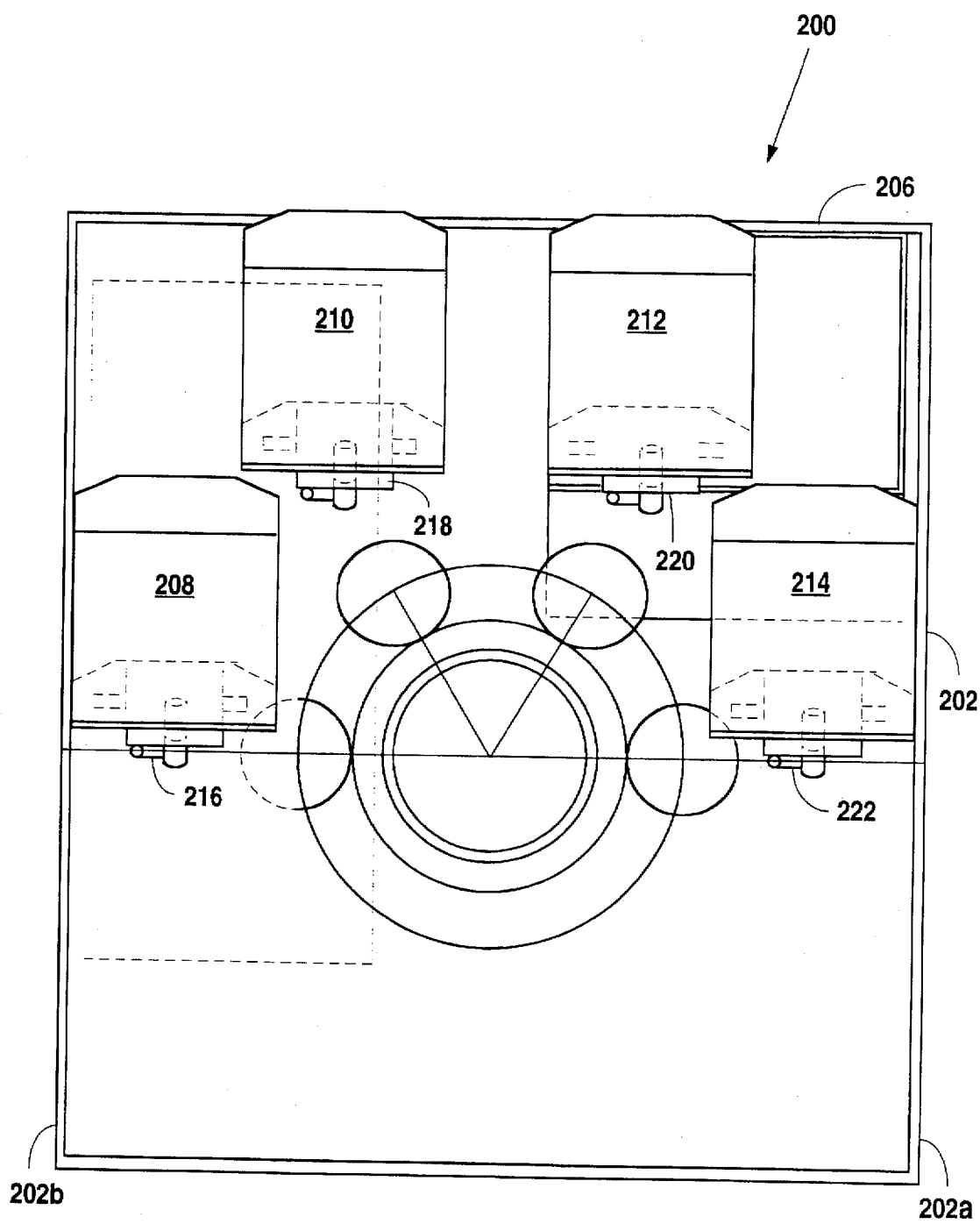
FIG. 3B is a top view of the robotic processing system of FIG. 3A.
Figure 3C:
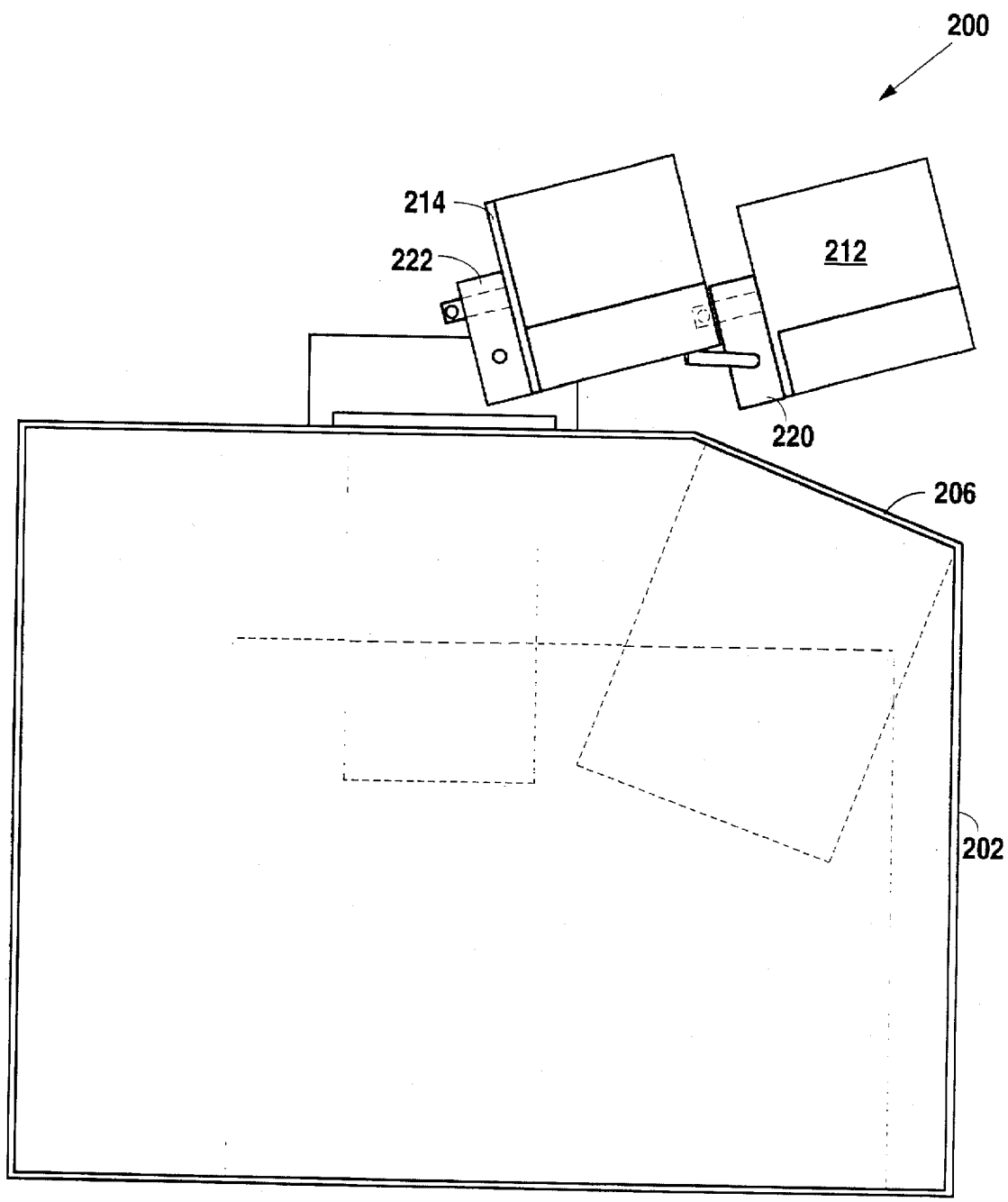
FIG. 3C is a side view looking along lines 3C—3C of FIG. 3A.

FIG. 3B is a top view of the processing station 200, and FIG. 3C is a side view looking along lines 3C—3C of FIG. 3A. When comparing FIGS. 2B and 3B, the cassette, 208, 210 have been rotated clockwise and the cassettes 212, 214 have been rotated counterclockwise. The inner cassettes 210, 212 have been rotated 30° and the outer cassettes 208, 214 have been rotated 90°. FIGS. 3A—3C clearly illustrate that the new loading positions are more convenient for an operator positioned at the front panel 206. In particular, when comparing the relative positions of the cassettes 208, 210, 212 and 214 as shown in FIGS. 2B and 3B, each of the cassettes are substantially closer to the front panel 206 in the loading positions shown in FIG. 3B. Furthermore, all of the cassettes 208, 210, 212 and 214 are similarly oriented, having their upper ends 208b, 210b, 212b and 214b aligned parallel with the front panel 206. Thus, an operator can load all of the cassettes 208, 210, 212 and 214 from the front panel without having to walk around to the sides 202a, 202b of the processing station 200.

Furthermore, the operator need not rotate or otherwise orient each of the cassettes 208, 210, 212 and 214 before loading or unloading onto the respective stage assemblies 216, 218, 220 and 222. Proper orientation relative to the central robot 204 in the processing positions are handled by the stage assemblies 216, 218, 220 and 222, as will be described more fully below. This substantially reduces the loading and unloading problems described previously, where an operator need only place each of the cassettes 208, 210, 212 and 214 at an identical orientation regardless of the relative position of the stage assemblies.

Figure 4A:
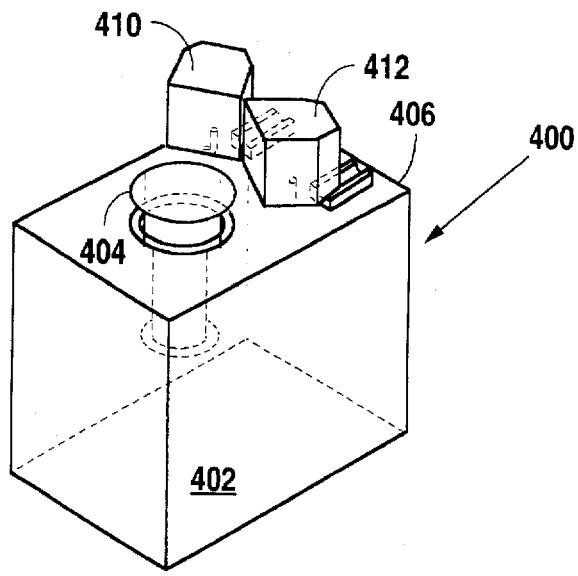
FIG. 4A is a perspective view of a robotic processing system according to the present invention with two stages in processing positions.
Figure 4B:
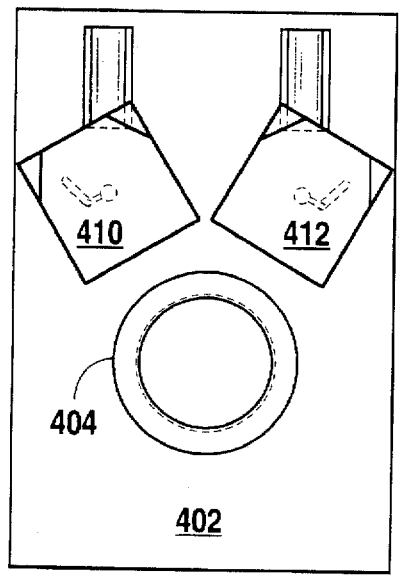
FIG. 4B is a top view of FIG. 4A.
Figure 4C:
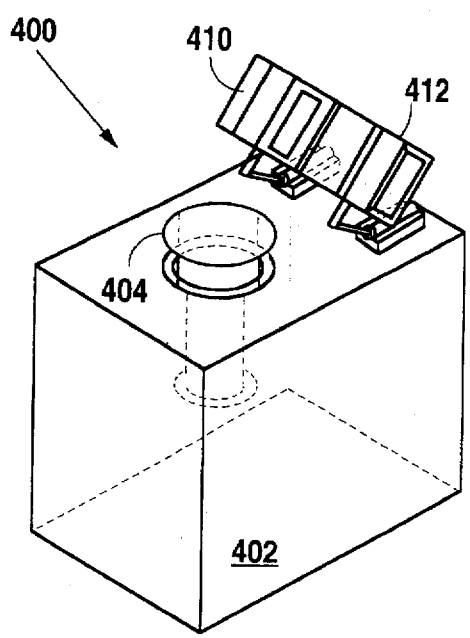
FIG. 4C is a perspective view of the robotic processing system of FIG. 4A, where the stages are in loading positions.

FIG. 4A is a perspective view of a similar but smaller processing system 400 including a frame 402, a central robot 404 and a front panel 406. Two stage assemblies (not shown) and corresponding two cassettes 410, 412 are shown in the processing position for efficient access by the central robot 404. FIG. 4B is a top view of the processing station 400. FIG. 4C is a perspective view of the processing station 400 with the cassettes 410, 412 positioned in their loading positions. FIGS. 4A–4C illustrates that the present invention is also applicable to smaller as well as larger processing stations having any number of stage assemblies;

Referring now to FIG. 5A, a more detailed perspective view is shown of a stage assembly 500 for receiving and supporting a cassette, such as the cassette 100 of FIG. 1 or any of the cassettes 208, 210, 212 or 214. As described further below, the stage assembly 500 may be adjusted for operating as any of the stage assemblies 216, 218, 220 and 222 shown in FIGS. 3A, 3B. Such adjustments determine the relative rotation between the processing positions as shown in FIG. 2A as compared to the loading positions shown in FIG. 3A.

The stage assembly 500 includes an L-shaped cassette support assembly 502 for receiving and supporting a cassette. The cassette support assembly 502 includes a stage plate 504 and a stage locator plate 506 for receiving and interfacing the bottom side 104 of the cassette 100. For purposes of a clean room environment, the stage plate 504 is preferably made of stainless steel and the stage locator plate 506, mounted to the stage plate 504, is preferably made of a hardened plastic, such as Delrin. A backplate 508 also made of stainless steel is integrally and orthogonally mounted to the stage plate 504 for receiving and interfacing the back side 106 of the cassette 100. A backrest 510 is mounted to the back plate 508, where the backrest 510 also preferably comprises plastic, such as Delrin, similar to the stage locator plate 506. The backrest 510 preferably includes slots 512 for receiving and supporting the alignment fins 107 of the cassette 100. In this manner, when the stage assembly 500 is in the position shown, such that the backplate 508 and backrest 510 are substantially horizontal and tilted slightly upwards, it provides support of the cassette 100 primarily from its back side 106 for tilting the open face 112 of the cassette 100 in an upward direction.

The cassette support assembly 502 is pivotally mounted, as described further below, to an actuation and support assembly 520. The actuation and support assembly 520 preferably includes a frame assembly 522 and an actuation assembly 536. The frame assembly 522 includes a base frame 524 mounted to an end frame 526 of a bearing block assembly 527. In particular, the end frame 526 is an L-shaped Bracket mounted orthogonally along the top of the base frame 524. The bearing block assembly 527 includes a frame plate 528 integrally and orthogonally mounted along the length of the end frame 526, and to a similar, but opposite end frame 530 (FIG. 5B) on the other side of the frame plate 528. The frame assembly 522 including the base frame 524, the end frames 526, 530 and the frame plate 528 preferably comprises a strong but lightweight metal, such as On the lower end of the base frame 524, bearings 532 are provided for pivotally mounting a motor bracket 534 of the actuator assembly 536. The actuator assembly 536 further includes a linear actuator motor 538 mounted to the motor bracket 534. In this manner, the motor bracket 534 and actuator motor 538 pivot relative to the base frame 524 for facilitating moving or tilting of the cassette support assembly 502, as described further below. Such movement is further facilitated by a connecting rod or lead screw 540, which is interfaced with the actuator motor 538 for applying thrust force. In particular, the lead screw 540 penetrates through the actuator motor 538 engaging gear or screw mechanisms therein (not shown) for applying thrust force. A rubber or plastic damping bushing 539 is placed on the lower end of the lead screw 540 for damping vibration. The bushing 539 eliminates high-pitched squeal when of the lead screw as it is being moved. A processing position sensor 541 is preferably mounted to the end frame 526 for interfacing a corresponding processing position flag 543 for purposes of control and for determining final desired processing position, described further below.

FIG. 5B is a reverse angle perspective view of the stage assembly 500 shown in FIG. 5A. FIG. 5B more clearly shows the frame assembly 522, including the end frames 526 and 530 mounted on either end of the frame plate 528. The end frames 526 and 530 include extensions 526a and 530a, respectively, each of which include bearings 526b, 530b for receiving and supporting a shaft 542. The shaft 542 is positioned between the end frames 526 and 530 and penetrates through a rotating plate 544, thereby allowing pivotal rotation of the rotating plate 544 relative to the frame assembly 522. A crank arm 546 is integrally mounted with the rotating plate 544 where the crank arm 546 is pivotally mounted to a lead screw clamp 548. The lead screw clamp 548 is mounted to the upper end of the lead screw 540, which interfaces the linear actuator motor 538 at its lower end.

A gear blank 550 is integrally mounted to the bottom side of the stage plate 504 and further includes a rotating shaft 552, which is placed through a bearing 554 on one end of the rotating plate 544. In this manner, the cassette support assembly 502 pivots or otherwise swivels relative to the rotating plate 544, as indicated by an arrow 556. Thus, the cassette support assembly 502 both pivots and rotates relative to the frame assembly 522.

A first rod linkage 557 including a first ball joint 555 is mounted on one end of the rotating shaft 552, where the first ball joint 555 and the rotating shaft 552 are part of a rod linkage assembly 558. The rod linkage assembly 558 further includes a linkage arm 560 having its upper end pivotally mounted to the first ball joint, 555 and its lower end pivotally mounted to a second ball joint 562, which is mounted to a bracket 564. The bracket 564 is preferably mounted to the end frame 530. The cassette support assembly 502 pivots about the rotating shaft 552 in direction of the arrow shown at 556 as controlled by the linkage assembly 558, which maintains the cassette support assembly 502 at the particular point of rotation shown in FIG. 5B when in the loading position. During such movement, the upper end of the linkage arm 560 moves to trace a helix for controlling swivel of the cassette support assembly 502.

The processing position flag 543 is shown mounted to the bottom side of the stage plate 504 for interfacing the processing position flag 541 when in the processing position, as described below. Also, a loading position flag 559 mounted to the rotating plate 544 interfaces a loading position sensor 561, which is mounted to the frame plate 528. The sensors 541,561 are preferably light emitting diode (LED) type sensors projecting a light beam onto a corresponding sensor, where the light beam is interrupted by the corresponding flag 543, 559, respectively, when the respective positions are achieved. Although not shown, electronic motor drive and control circuitry is connected to the assembly motor 538 and the sensors 541,561 for operating the assembly motor 538 in the appropriate direction, and for stopping the actuator motor 538 when a corresponding sensor is tripped indicating movement is completed.

FIG. 5C is a perspective view of the stage assembly 500 positioned in its processing position after manipulation by the actuator assembly 536. In particular and relative to FIG. 5A, the actuator motor 538 applied thrust force on the lead screw 540 in a downward direction as indicated by an arrow 570, thereby pulling the lead screw clamp 548 downwards, which pivoted the crank arm 546 and thus the rotating plate 544 in a clockwise direction, as indicated by an arrow 572. To facilitate such pivoting motion, the actuator assembly 536 also pivoted in a counter-clockwise direction, as indicated by an arrow 574, when it applied the thrust force to pull down on the crank arm 546. As described further below, the linkage assembly 558 further caused the cassette support assembly 502 to rotated in a clockwise direction relative to the loading position (FIG. 5A), as shown by an arrow 576, which swiveled the cassette support assembly 502 to face a central robot (not shown). The processing position flag 543 is shown interfacing the processing position sensor 541.

Comparing FIGS. 5A and 5C, the cassette support assembly 502 is liked so that the stage plate 504 and stage locator plate 506 are now substantially positioned horizontally for supporting the bottom side 104 of a cassette 100. The backplate 508 and backrest 510 are positioned vertically upwards for supporting the cassette 100 when a robot processing system is inserting or otherwise retrieving substrates within the cassette 100.

FIG. 5D is a reverse angle view of the stage assembly 500 of FIG. 5C. Arrows 572 indicate the rotation that occurred of the rotating plate 544 as facilitated by the shaft 542 and the bearings 526a, 530a relative to the frame assembly 522. The actuator motor 538 interfaced the lead screw 540 to apply thrust force in a downward direction, which pulled down on the crank arm 548. FIG. 5D more clearly shows the new position of the linkage assembly 558, which manipulated the rotating shaft 552 relative to the end frame 530 and thus the frame assembly 522. Since the length of the linkage arm 560 remains fixed between the loading and processing positions, the linkage arm 560 applies force on the ball joint 556 for rotating the rotating shaft 552 to thereby rotate the cassette support assembly 502.

After processing is completed and it is desired to unload the current cassette and load a new cassette, the actuator motor 538 is activated in the opposite direction to apply thrust force upwards on the lead screw 540. The actuator assembly 536 rotates in an opposite direction as indicated by the arrow 574, the rotating plate 544 and cassette support assembly 502 rotate in the opposite direction as indicated by the arrow 572, and the cassette support assembly 502 further swivels in the opposite direction as indicated by the arrow 572 to place the cassette support assembly 502 in the loading position shown in FIG. 5A. The electronic control circuitry determines that the loading position is reached when the loading position sensor 561 is tripped by the loading position flag 559, as shown in FIG. 5B.

Figure 6B:
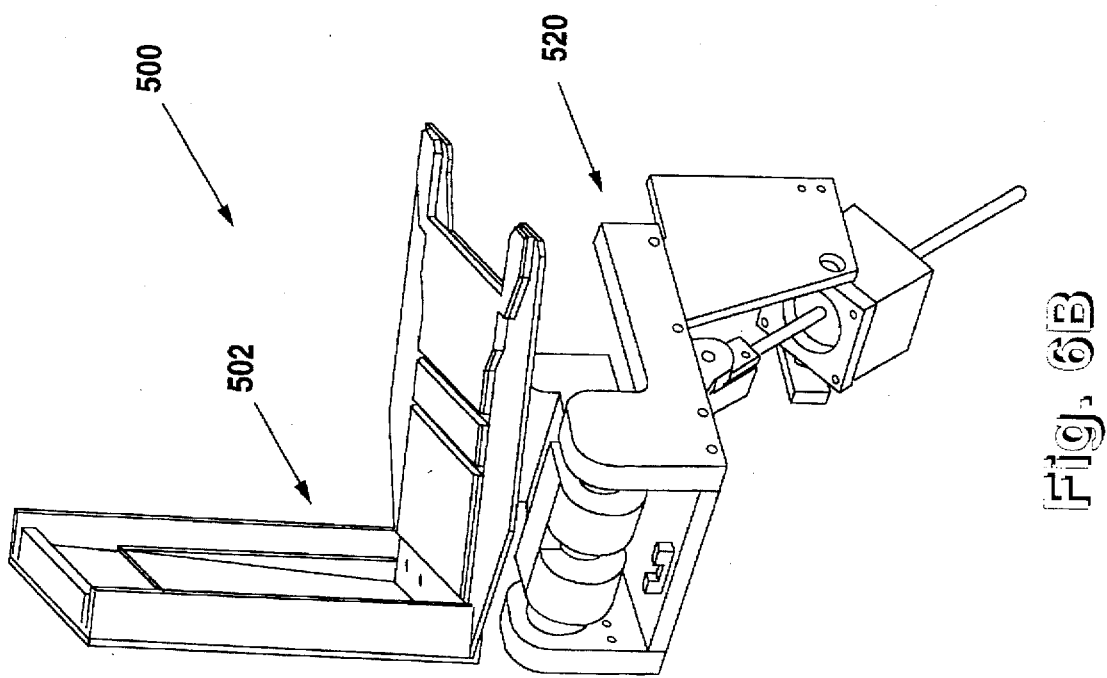
FIG. 6B is a perspective view of the stage assembly of FIG. 6A in a processing position, illustrating that the amount of swivel is adjustable.
Figure 6A:
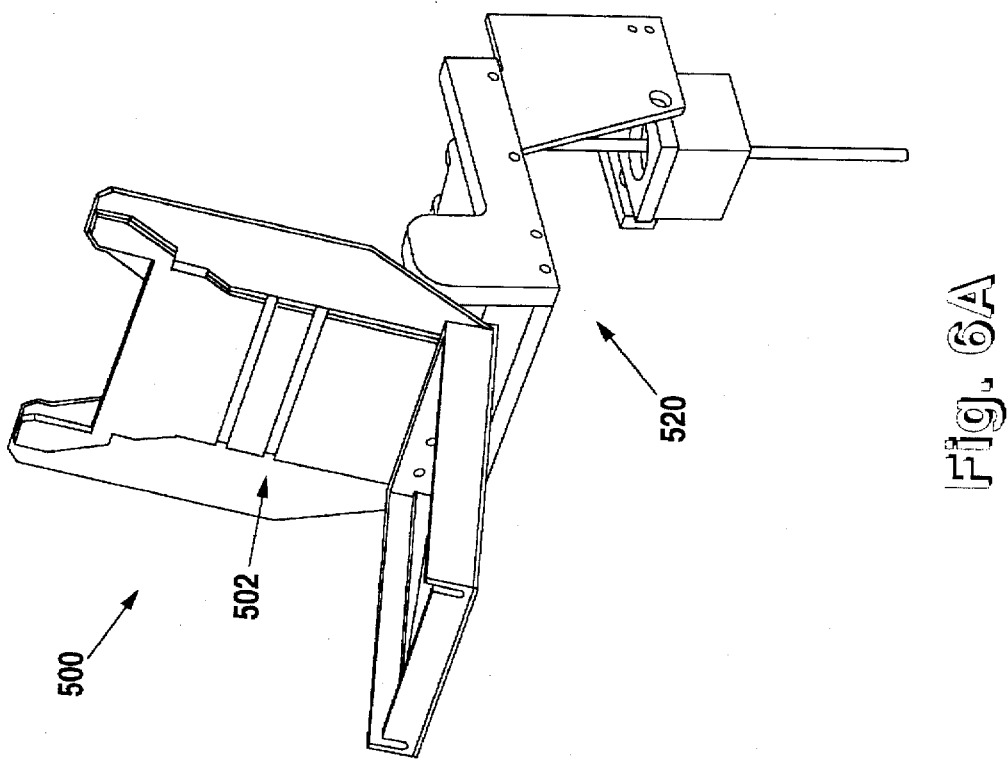
FIG. 6A is a perspective view of the stage assembly as shown in FIG. 5A in a loading position.

FIGS. 6A and 6B illustrate the stage assembly 500 in its loading and processing positions, respectively, except showing an increased amount of rotation of the cassette support assembly 502 when in the processing position, as shown in FIG. 6B. The difference in rotation between FIGS. 6B and 5C is due to the fact that the second ball joint 562 is mounted to a second bracket 565 rather than to the bracket 564 as shown in FIG. 5D. Also, the linkage arm 560 is telescopically adjustable for adjusting its length to thereby adjust the amount of rotation of the cassette support assembly 502. In this manner, simply moving a ball joint and adjusting the length of the linkage arm 560 accounts for a greater amount of rotation of the stage assembly 500. This accounts for the difference in rotation of the stage assemblies 216 and 222 relative to the rotation of the stage assemblies 218 and 220 as shown between FIGS. 2A and 3A. A greater amount of rotation is required for the outer stage assemblies 216, 222 as compared to the inner stage assemblies 218 and 220 in order to align all of the stage assemblies and thus the corresponding cassettes 208, 210, 212 and 214 relative to the front panel 206.

It is now appreciated that a stage assembly for a substrate processing system according to the present invention enables convenient access of cassettes for loading and loading from the front panel in a loading position, and also enables access of the substrates by a processing system during processing in a processing position. An actuation and support assembly supports and moves a cassette support assembly between the loading and processing positions. The loading position places the cassette closer to the front panel, where the cassette is further aligned with the front panel to prevent an operator from having to stretch and twist his or her arms. This is particularly advantageous for a multiple stage processing station with a central robot system, where the operator has much greater access to outer stages alleviating the need to stretch and twist or walking around the sides of the station for loading/unloading cassettes. A stage assembly according to the present invention thus substantially increases efficiency while also reducing or otherwise eliminating other problems typically associated with loading/unloading substrate cassettes.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A stage assembly for a substrate processing system which processes at least one substrate inserted within a cassette, comprising:

a cassette support assembly for receiving and supporting a cassette; and an actuation and support assembly for supporting and moving said cassette support assembly between a loading position for loading and unloading cassettes and a processing position to enable access of substrates within the cassette by a processing system, said actuation and support assembly comprising:

a frame assembly;

a rotating plate pivotally mounted to said frame assembly and mounted to said cassette support assembly for rotating said cassette support assembly relative to said frame assembly;

a motor bracket pivotally mounted to said frame assembly;

an actuator motor mounted to said motor bracket;

a connecting rod pivotally mounted to said rotating plate and interfacing said actuator motor, wherein said actuator motor applies thrust force to said connecting rod for tilting said cassette support assembly between said loading and processing positions;

a crank arm mounted to said rotating plate; and a clamp mounted to said connecting rod and pivotally mounted to said crank arm.

2. The stage assembly of claim 1, wherein the cassette includes a back side and a bottom side, wherein said cassette support assembly comprises:

a back plate for interfacing the back side of the cassette; and a stage locator plate mounted to said back plate for interfacing the bottom side of the cassette.

3. The stage assembly of claim 2, wherein said cassette comprises a box-like structure, and wherein said back plate has one end mounted orthogonally to one end of said stage locator plate to form an L-shaped cassette support assembly.

4. The stage assembly of claim 1, wherein said connecting rod comprises a lead screw, and wherein said actuator motor comprises a linear actuator motor for applying thrust force to said lead screw.

5. The stage assembly of claim 1, wherein said frame assembly comprises:

a base frame having an upper end and a lower end;

bearings mounted on said base frame near said lower end for pivotally mounting said actuator assembly;

a bearing block assembly having a first end and a second end, said second end orthogonally mounted to said upper end of said base frame; and a bearing assembly mounted to said second end of said bearing block assembly for pivotally mounting said cassette support assembly.

6. The stage assembly of claim 5, wherein said bearing block assembly comprises: first and second end times; and a frame plate orthogonally mounted between said first and second end frames.

7. The stage assembly of claim 6, wherein said bearing assembly comprises:

a first bearing mounted to said first end frame;

a second bearing mounted to said second end frame; and a shaft pivotally mounted between said first and second bearings, wherein said rotating plate is mounted to said shaft for allowing pivoting of said cassette support assembly relative to said frame assembly.

8. The stage assembly of claim 1, further comprising:

a shaft assembly for pivotally mounting said cassette support assembly to said rotating plate allowing swivel movement of said cassette support assembly relative to said rotating plate; and a linkage assembly mounted between said frame assembly and said shaft assembly;

wherein said cassette support assembly is further rotated a predetermined amount relative to said rotating plate between said loading and processing positions when said actuator assembly applies force.

9. The stage assembly of claim 8, wherein said shaft assembly comprises:

a gear blank and shaft mounted to said cassette support assembly; and a bearing mounted to said rotating plate for rotatably interfacing said gear blank and shaft.

10. The stage assembly of claim 8, wherein said linkage assembly comprises:

a first ball joint mounted to said shaft assembly;

a second ball joint mounted to said frame assembly; and a linkage arm coupled between said first and second ball joints.

11. The stage assembly of claim 10, further comprising:

said second ball joint mounted to said frame assembly at a predetermined location; and said linkage arm being telescopically adjustable for adjusting its length;

wherein said predetermined amount of rotation of said cassette support assembly relative to said rotating plate is adjustable based on said predetermined location of said second ball joint and the length of said linkage arm.

12. The stage assembly of claim 1, wherein the substrate processing system includes a station frame supporting a central robot and a from panel, further comprising:

said stage assembly for mounting to the station frame to enable said actuator and support assembly to tilt and swivel said cassette support assembly between said processing position to allow access of substrates within the cassette by the central robot, and said loading position for allowing convenient access to load and unload the cassette from said front panel.

13. The stage assembly of claim 12, the cassette having an open face for inserting, removing and providing access of substrates inserted within, wherein the cassette open face directly faces the central robot while said cassette support assembly is in said processing position, and wherein the cassette open face has an upper end aligned parallel with the from panel while said cassette support assembly is in said loading position.

14. A substrate processing system for processing substrates within a plurality of cassettes, comprising:

a station frame;

a processing system mounted to said station frame;

a front panel located on one end of said station frame; and a plurality of stages mounted to said station frame, each comprising:

a cassette support assembly that receives and supports a corresponding cassette; and an actuation and support assembly that supports said cassette support assembly and that translates said cassette support assembly between a corresponding one of a plurality of loading positions for loading and unloading said corresponding cassette and a corresponding one of a plurality of processing positions to enable access of the substrates from said corresponding cassette by said processing system, and during translation, said actuation and support assembly rotates said cassette support assembly relative to a first axis and tilts said cassette support assembly relative to a second axis, orthogonal to said first axis;

wherein said actuation and support assembly of each of said plurality of stages aligns a corresponding cassette support assembly in parallel with said front panel when in a corresponding one of said plurality of loading positions.

15. The substrate processing system of claim 14, wherein each cassette includes an open face for inserting and accessing substrates inserted therein, comprising:

a first stage for receiving and supporting a first cassette and a second stage for receiving and supporting a second cassette, said first and second stages mounted to said station frame between said processing system and said front panel; and wherein said actuation and support assembly of said first and second stages each move the respective first and second cassettes to align their respective open faces towards said processing system in corresponding ones of said plurality of processing positions and position said respective first and second cassettes to be aligned with and near said front panel in corresponding ones of said plurality of loading positions.

16. The substrate processing system of claim 14, wherein each cassette includes an open face for inserting and accessing substrates inserted therein, comprising:

at least four stages, each for receiving and supporting a corresponding cassette, said at least four stages mounted to said station frame at respective locations forming a semicircle around said processing system and between said processing system and said front panel; and wherein said actuation and support assembly of said at least four stages each move the respective cassettes to align theft respective open faces towards said processing system in corresponding ones of said plurality of processing positions and position said respective cassettes to be aligned with and near said front panel in corresponding ones of said plurality of loading positions.

17. The substrate processing system of claim 16, wherein said at least four stages includes:

two inner stages mounted on either side of an orthogonal between said processing system and said front panel, wherein the respective open faces of the cassettes loaded on said two inner stages are aligned at 30 degrees relative to said front panel while in said corresponding ones of said plurality of processing positions; and two outer stages mounted on either side of said processing system, wherein respective open faces of the cassettes loaded on said outer inner stages each are aligned at 90 degrees relative to said front panel while in said corresponding ones of said plurality of processing positions;

wherein said actuation and support assemblies of said two inner and two outer assemblies position the open faces of the respective cassettes to tilt upwards and to be aligned with said front panel in said corresponding ones of said plurality of loading positions.

18. A method of positioning a plurality of substrate cassettes relative to a processing station including a central processing system and a front panel, comprising the steps of:

positioning each cassette into one of a plurality of tangential processing positions to enable the central processing system to access substrates within each cassette; and moving each cassette towards the front panel to a corresponding one of a plurality of loading positions each in parallel alignment with the front panel by simultaneously translating, rotating relative to a first axis and tilting relative to a second axis, orthogonal to said first axis each cassette for allowing convenient loading and unloading of the plurality of cassettes from the front panel.

19. The method of claim 18, wherein said positioning step comprises the step of:

positioning a face of each cassette at a tangential position relative to the central processing system.

20. The method of claim 18, wherein said moving step further comprises the steps of:

tilting a face of each cassette upwards; and aligning an upper end of each cassette parallel with the front panel.

* * * * *